May 18, 1965 A. J. SCHAEFFER 3,184,645

ELECTRICAL CIRCUIT ASSEMBLY

Filed March 24, 1960 3 Sheets-Sheet 1

INVENTOR
Aaron J. Schaeffer
BY
ATTORNEYS

INVENTOR
Aaron J. Schaeffer
BY
Bacon Edmonds Morton Brown Taylor
ATTORNEYS

May 18, 1965 A. J. SCHAEFFER 3,184,645

ELECTRICAL CIRCUIT ASSEMBLY

Filed March 24, 1960 3 Sheets-Sheet 3

INVENTOR
Aaron J. Schaeffer
BY
Pennie Edmonds Morton Barrows & Taylor
ATTORNEYS

United States Patent Office 3,184,645
Patented May 18, 1965

3,184,645
ELECTRICAL CIRCUIT ASSEMBLY

Aaron J. Schaeffer, Farmingdale, N.Y., assignor to Cutler-Hammer, Inc., Milwaukee, Wis., a corporation of Delaware Filed Mar. 24, 1960, Ser. No. 17,303
2 Claims. (Cl. 317—101)

The present invention relates to electrical apparatus assemblies and more particularly to wired electrical circuit assemblies which may be compactly stacked and which provide easily accessible support mountings for a large number of associated circuit components.

Through the years a continuing trend has existed toward miniaturization of electronic components and reduction in the size of apparatus employing these components. The latter involves placing a large number of components in a relatively small volume. One of the important problems that has confronted the design engineer in this connection has been that of providing for the reliable, compact packaging of electronic equipment in a manner allowing convenient accessibility for testing and servicing. The design of electronic apparatus for space equipment and the like has placed an even greater burden on the systems design engineer along these lines.

Plug-in units have sometimes been employed in complex equipment so as to allow convenient removal for testing and servicing. However, plug-in connections are themselves subject to malfunctioning, and hence impair reliability. For greatest reliability, permanent connections (usually soldered) are preferable. It is therefore desirable to provide for accessibility while at the same time allowing the use of permanent connections, and without unsoldering or otherwise breaking the permanent connections. If possible, this should be accomplished without adding substantial weight or volume.

It is a principal object of this invention to provide a new and improved means for mounting a large number of associated and interwired electronic components in a relatively small volume, with ready accessibility.

Another object of the invention is to provide an improved packaging means for a large number of associated electronic components which permits a maximum amount of permanent wiring between components to promote operational reliability, and at the same time permits easy accessibility to all components.

A further object of this invention is to provide an improved and simplified electronic circuit assembly which utilizes the electrical interconnecting wiring between the supported components as mechanical hinges to afford easy accessibility to all components with a minimum amount of mechanical structure.

In accordance with the teachings of this invention, a plurality of component mounting boards are provided for supporting a large number of associated electronic components (e.g., transistors, resistors, capacitors, etc). Preferably components are mounted on both sides of the boards. Provision is made for mounting these boards in adjacent spaced parallel planes within a common integral housing. Components are mounted on both sides of each board with appropriate interconnections, and the wiring between different boards within the same housing is permanently connected (e.g., soldered) to afford maximum operational reliability. The interboard wiring is arranged and cabled so that the conductors depart from a given board along one edge thereof. Flexible conductors (e.g., multi-strand wires) are employed which dually serve as mechanical hinges to afford easy rotational removal of each board from its housing.

In a preferred embodiment of the invention four cable-hinged double-sided component mounting boards are permanently wired together within each of two separate housings. The two separate housings are stacked together and permanent wiring between the two housings is completed via one or more exterior hinge-cables connected between the two housings. The cabling permits hinging one of the stacked housings with respect to the other so as to provide direct access to all of the component mounting boards mounted in both housings. The inside surface of each individual board can be easily exposed by rotating the board outwardly with respect to its housing on its interconnecting hinge-cable. Thus by virtue of the cable hinging features provided between each individual board and its housing as well as that provided between the separate housings, access is conveniently gained to either side of any one of the eight boards and at the same time a maximum amount of permanent wiring may be employed to promote circuit performance reliability. Additionally, due to the structural simplicity of the assembly (e.g., no interconnecting plugs and no mechanical hinges) a minimum of weight and space are required for a given electronic circuit assembly.

The invention as to its organization and manner of operation, together with further objects and advantages thereof, may best be understood by referring to the drawings and the detailed description which follows.

Figures 1, 2:
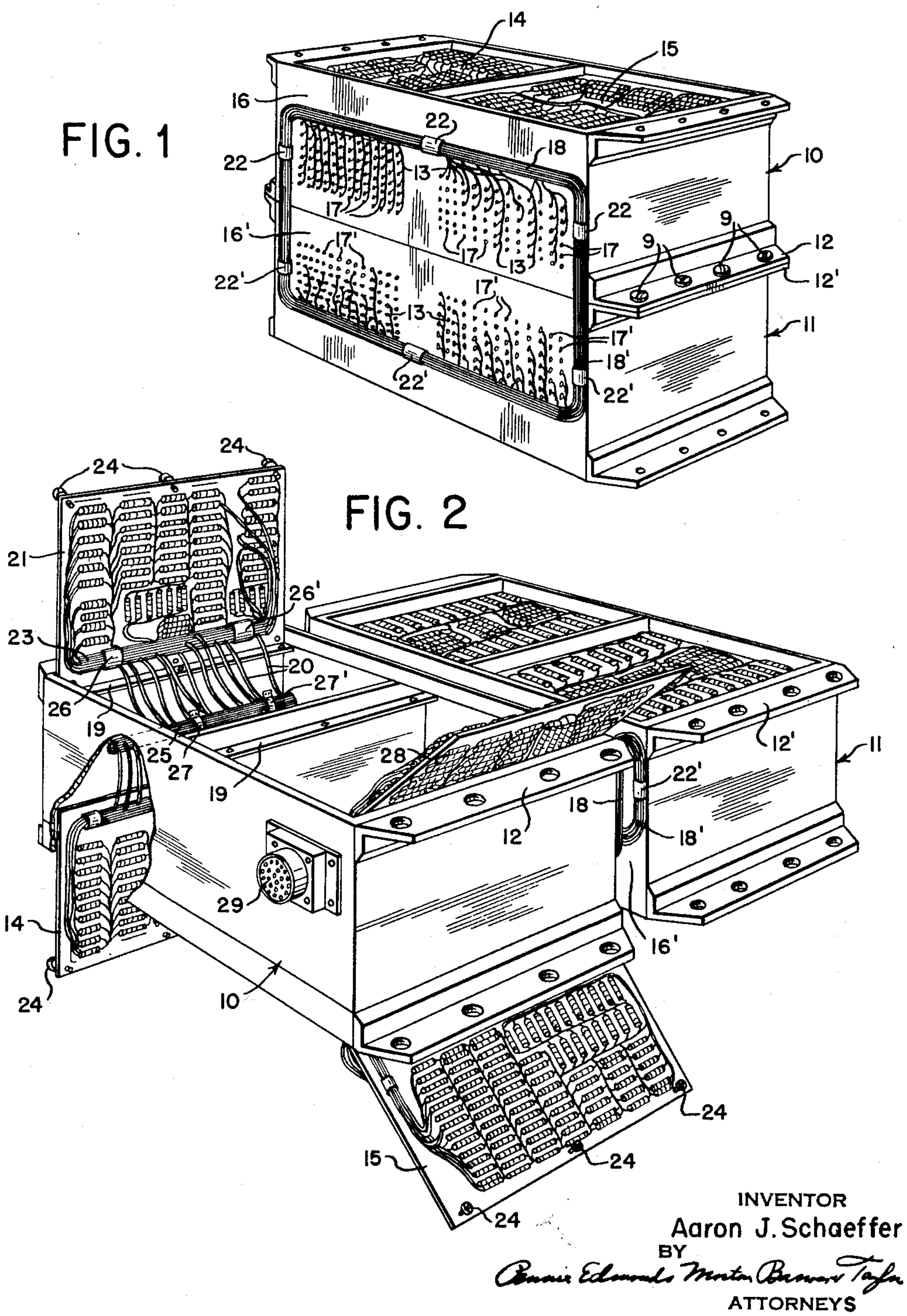
FIG. 1 is a perspective view showing one embodiment of the present invention.
FIG. 2 is a perspective view of the apparatus of FIG. 1 showing the general disposition and operation of the various interconnecting hinge-cables.

Referring to FIG. 1, two similar sectional housings 10 and 11 are provided for supporting a plurality of component mounting boards in adjacent spaced parallel planes. The housings, stacked one above the other, are advantageously made of light-weight metal such as aluminum and are adapted to be secured together by removable fasteners, such as screws 9 in mating flanges 12 and 12'. Two component mounting boards 14 and 15 are shown supported in a common plane in the upper region of housing 10. Each housing is adapted to support a total of four such boards in two separate spaced planes.

Terminal boards 16 and 16', each having a plurality of connector pins 17 and 17', are provided along the sidewalls of the two housings to permit convenient interconnections between components and circuits located in the separate housings. The various individual conductors 13 are advantageously solder-connected to the pins on the two terminal boards and formed into two hinge-cables 18 and 18'. These cables are adapted to jointly bend at the juncture of the housings, thereby permitting separation of the top housing 10 from the lower housing 11 by a general hinge action of the two cables as shown in FIG. 2. When the two housings are so disposed, any or all eight component mounting boards (four in each housing) may be opened about their respective hinge-cables, thereby providing easy access to all components mounted on either side thereon. Preferably the cabled sections 18, 18' are anchored to housings 10 and 11, as by cable clamps 22, 22′ for mechanical security, especially during the hinging and reclosing of the housings.

Each component board is normally secured to internal flanges 19 by removable fasteners such as cap screws 24. Electrical conductors 20 to each component board are arranged and cabled as shown at 23 so that all leads depart from the board along a single edge, as shown, providing thereby a convenient means for hinging board 21 outwardly with respect to the housing to afford easy access to all components mounted on the underside thereof.

To avoid the danger of breaking soldered connections in opening and closing, the cabled section 23 of each board is anchored to the respective board by suitable means such as cable clamps 26, 26′. It is also preferred to form wires 20 into an intermediate cabled section 25 anchored to the wall of the housing by cable clamps 27, 27′. Interconnections between boards 14 and 21 are made via cabled section 25 to cabled section 23 and a similar cabled section on board 14. Interconnections between boards 15 and 28 are made similarly. Interconnections between boards 14, 21 and boards 15, 28 may be made via pins 17 in respective portions of terminal board 16. Preferably the connections from the boards to pins 17 are made through the intermediate cabled section 25.

Interconnections in the lower housing 11 may be made in a similar manner.

It should be noted that easy access to all components is made available by the assembly shown, without the need for unsoldering any of the interconnections between the many circuit components. Thus a large number of easily accessible electronic components can be mounted in a small compact assembly with a maximum amount of directly-connected permanent type wiring, affording thereby optimum operational reliability.

Input and output connections to the electronic circuits in the housing may be made via multiple contact connector 29. The contacts of the connector may be connected to terminals 17 of the connecting board 16, or to conductors in the intermediate cabled sections, etc. according to circuit requirements.

Cover plates (not shown) may be removably secured over the openings in the top and bottom faces of the stacked housings.

Figures 3, 4, 5:
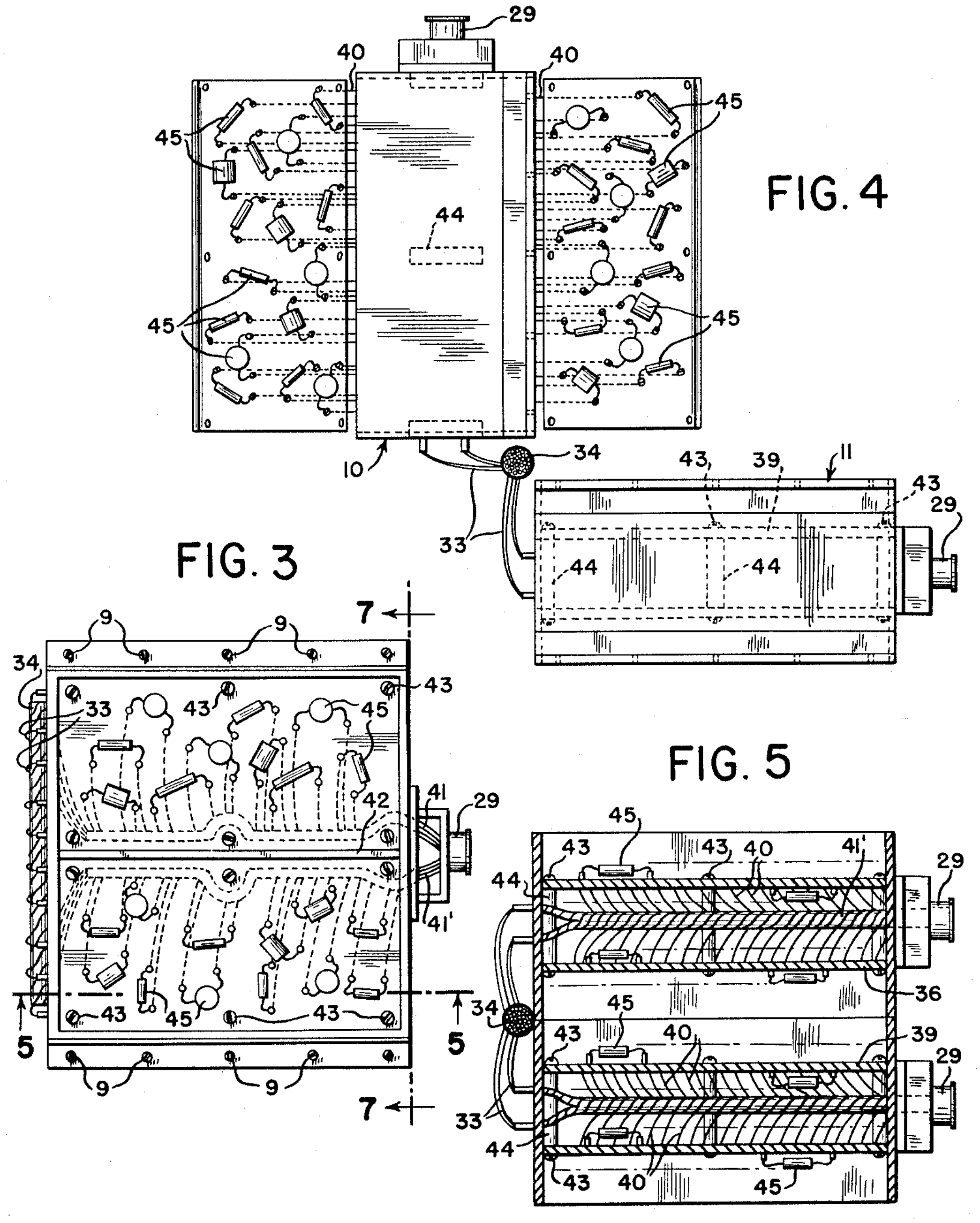
FIG. 3 is a top plan view of another embodiment of the invention showing the general disposition of components and wiring cables.
FIG. 4 is a side view of the embodiment of FIG. 3 with portions opened for test or servicing.
FIG. 5 is a section taken along the line 5—5 of FIG. 3.
Figure 6:
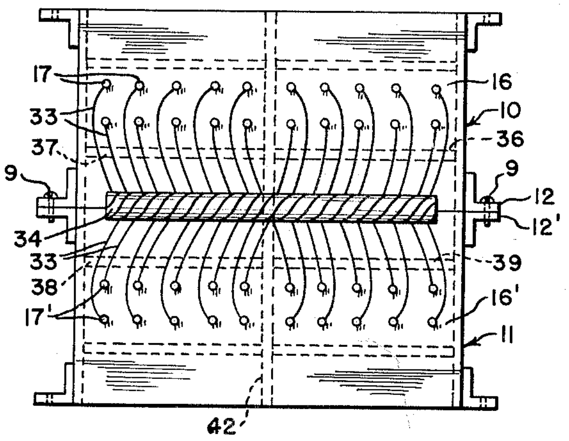
FIG. 6 is an end view of the assembly of FIG. 3 showing the exterior hinge-cable between the separate housings.

FIGS. 3 through 7 show various views of a second embodiment of the invention. While the general features of this embodiment are similar to those shown in the embodiment of FIGS. 1 and 2, the cable hinging features are arranged somewhat differently. Referring to FIG. 6 it will be noted that the individual conductors 33, provided to externally interconnect terminal boards 16 and 16′ on housings 10 and 11 respectively, are combined to form a single central cabled section 34 disposed adjacent and parallel to the juncture line of the two housings. The two housings may be readily separated by removing fasteners 9 from flanges 12 and 12′. Housing 10 may then be hinged upwardly from housing 11 about cable 34 as indicated in FIG. 4. The individual conductors, which are advantageously of the multiple strand type, afford desired hinging action by flexing severally and jointly and thereby provide access to the interior component boards 36, 37, 38 and 39 (FIG. 6).

Figure 7:
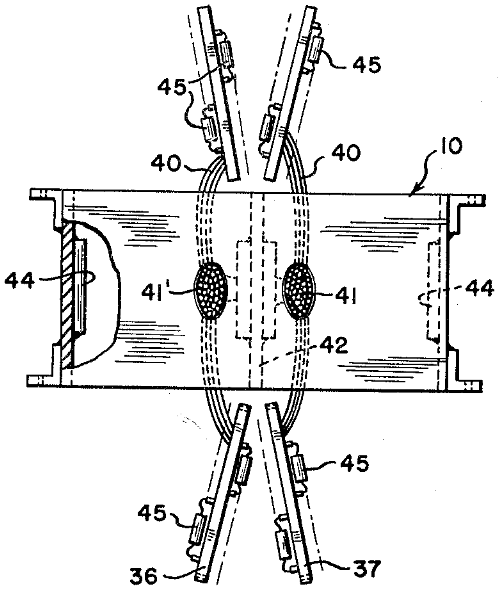
FIG. 7 is a view of the upper housing of FIG. 3 taken along the line 7—7, with the component boards in open position.

Direct point-to-point wiring between the various component boards and the terminal boards is afforded by individual leads 40 distributed along adjacent parallel edges of respective pairs of boards which are combined to form central distribution cables 41, 41′ (see FIGS. 5 and 7). These cables are advantageously secured to a central wall support 42. Interconnections between the pair of boards connected by cabled section 41 and those connected by section 41′ may be made via the external terminal board 16 or by interconnections between sections 41 and 41′ through a suitable opening (not shown) in wall 42.

The individual component boards may be readily removed from their main housing by removing fasteners 43 which anchor the boards to the housing via support posts 44. The individual component boards may then be hinged upwardly (or downwardly) and inwardly with the individual conductors 40 jointly serving as support hinges. Convenient access is thereby afforded to all of the components 45 which are mounted on both sides of the mounting boards.

If desired, instead of forming the conductors 40 into a single central cable 41 between the boards of a pair, the conductors may be combined to form a plurality of hinge cable sections similar to the exterior cables 18 and 18′ as shown in FIG. 1. In such case each cable section may be clamped to both boards of a pair. Also, the mid-point of each cable may be clamped to the central wall 42. Furthermore, the mounting boards may be hinged from different walls of the main housings and the housings may be stacked in a variety of ways all in accordance with the general teachings of the invention.

An outstanding feature of the assembly apparatus provided by this invention resides in the fact that easy access is afforded to all components for testing or maintenance purposes and the like without the need for disrupting or removing electrical power from any of the circuits or components. Another feature which should be noted resides in the flexibility with which two or more housings may be combined in stacked combinations to accommodate electronic systems of varying complexities within a minimum space allotment.

Although several preferred embodiments of the invention have been described herein, it will be understood that various changes and modifications may be made within the scope of the invention.

I claim:

1. An electrical circuit assembly, comprising two mounting boards each supporting circuit components, means disengagably supporting said boards in overlying relationship, a plurality of flexible insulated conductors interconnecting the components on one of said boards with those on the other, said conductors extending from points along respective approximately parallel adjacent edges of said boards and being formed into a cabled section parallel to and between said edges, said flexible conductors and cabel section constituting sole hinging means between said mounting boards, for swinging movement of said boards out of overlying relationship when disengaged from said board supporting means.

2. The invention set forth in claim 1, further including means securing said cable section to said board supporting means, said flexible conductors being formed into two further cabled sections along the respective adjacent edges of said boards, and means securing said further cabled sections to the respective boards.

References Cited by the Examiner

UNITED STATES PATENTS

| | | | |
|---|---|---|---|
| 1,848,837 | 3/32 | Powers | 317—99 |
| 2,191,637 | 2/40 | Wier | 317—122 |
| 2,245,338 | 6/41 | Hammond | 174—52 |
| 2,659,843 | 11/53 | McNicol | 317—120 |
| 2,740,097 | 3/56 | Edelman | 339—17 |

FOREIGN PATENTS

| | | |
|---|---|---|
| 134,516 | 8/33 | Austria. |

JOHN F. BURNS, *Primary Examiner.*

LLOYD McCOLLUM, SAMUEL BERNSTEIN, *Examiners.*